US010734954B2

United States Patent
Gambero et al.

(10) Patent No.: US 10,734,954 B2
(45) Date of Patent: Aug. 4, 2020

(54) OPERATIONAL AMPLIFIER, CORRESPONDING CIRCUIT, APPARATUS AND METHOD

(71) Applicant: STMicroelectronics S.r.l., Agrate Brianza (IT)

(72) Inventors: Andrea Gambero, Buscate (IT); Davide Ugo Ghisu, Milan (IT); Sandro Rossi, Pavia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 335 days.

(21) Appl. No.: 15/691,298

(22) Filed: Aug. 30, 2017

(65) Prior Publication Data

US 2018/0248522 A1 Aug. 30, 2018

(30) Foreign Application Priority Data

Feb. 24, 2017 (IT) .............................. 102017021364

(51) Int. Cl.
*H03F 1/14* (2006.01)
*H03F 1/30* (2006.01)
(Continued)

(52) U.S. Cl.
CPC .............. *H03F 1/305* (2013.01); *H03F 1/307* (2013.01); *H03F 3/187* (2013.01); *H03F 3/217* (2013.01);
(Continued)

(58) Field of Classification Search
CPC .......... H03F 1/305; H03F 1/307; H03F 3/187; H03F 3/72; H03F 3/302; H03F 3/45475;
(Continued)

(56) References Cited

U.S. PATENT DOCUMENTS 4,222,113 A    9/1980   Hansen
4,255,782 A    3/1981   Joyce
(Continued)

FOREIGN PATENT DOCUMENTS

WO    2011/079881 A1    7/2011

OTHER PUBLICATIONS

Bianchi et al., "Analysis and Design of a High Voltage Integrated Class-B Amplifier for Ultra-Sound Transducers," *IEEE Transactions on Circuits and Systems—I: Regular Papers* 61(7):1942-1951, Jul. 2014.

(Continued)

*Primary Examiner* — Khanah V Nguyen
(74) *Attorney, Agent, or Firm* — Seed IP Law Group LLP

(57) ABSTRACT

An operational amplifier including an input stage coupled to an input terminal, an output stage coupled to an output terminal, and a gain node between the input stage and the output stage. A bias current source is couplable to the input stage to supply a bias current thereto and a current mirror circuit mirrors the bias current toward the gain node and the output stage. A switch circuit includes a switch activatable to bring the gain node to a pre-bias voltage and a switch coupled to the output stage and switchable between a first state and a second state in which the output stage is active and non-active, respectively—. A further switch circuit is coupled to the output terminal and switchable between a first state and a second state in which the output stage is coupled to the output terminal and to a reference level, respectively.

19 Claims, 5 Drawing Sheets

(51) Int. Cl.
*H03F 3/217* (2006.01)
*H03F 3/45* (2006.01)
*H04R 3/00* (2006.01)
*H03F 3/30* (2006.01)
*H03F 3/72* (2006.01)
*H03F 3/187* (2006.01)

(52) U.S. Cl.
CPC ......... *H03F 3/302* (2013.01); *H03F 3/45475* (2013.01); *H03F 3/72* (2013.01); *H04R 3/00* (2013.01); *H03F 2200/03* (2013.01); *H03F 2200/297* (2013.01); *H03F 2200/516* (2013.01); *H03F 2203/30099* (2013.01); *H03F 2203/30132* (2013.01)

(58) Field of Classification Search
CPC ............... H03F 3/217; H03F 2200/297; H03F 2200/03; H03F 2203/30132; H03F 2203/30099; H03F 2200/516; H03F 3/21; H03F 1/0211; H04R 3/00; G05F 1/56
USPC ...... 330/51, 207 A, 251, 255, 257, 263–265, 330/288
See application file for complete search history.

(56) References Cited

U.S. PATENT DOCUMENTS

| | | | |
|---|---|---|---|
| 4,321,485 A | 3/1982 | Morozowich et al. | |
| 4,353,004 A | 10/1982 | Kleinschmidt | |
| 4,357,690 A | 11/1982 | Kuroda et al. | |
| 4,453,073 A | 6/1984 | Bredenkamp | |
| 5,321,597 A | 6/1994 | Alacoque | |
| 6,050,945 A | 4/2000 | Peterson et al. | |
| 6,074,346 A | 6/2000 | Oppelt | |
| 6,083,164 A | 7/2000 | Oppelt et al. | |
| 6,316,993 B1 | 11/2001 | Hellums | |
| 6,342,805 B1 | 1/2002 | Chen | |
| 7,402,984 B1* | 7/2008 | Huang | G05F 1/56 323/274 |
| 7,977,820 B2 | 7/2011 | Chu et al. | |
| 8,447,046 B2 | 5/2013 | Huang et al. | |
| 8,760,169 B2* | 6/2014 | Tang | H03F 1/0211 324/434 |
| 9,455,693 B2 | 9/2016 | Ghisu et al. | |
| 9,979,363 B2* | 5/2018 | Ko | H03F 3/45273 |
| 2005/0146371 A1 | 7/2005 | Wodnicki | |
| 2005/0171431 A1 | 8/2005 | Petersen | |
| 2005/0256409 A1 | 11/2005 | Pomata et al. | |
| 2005/0275310 A1 | 12/2005 | Ripoll | |
| 2006/0184033 A1 | 8/2006 | Cerofolini | |
| 2007/0046143 A1 | 3/2007 | Blandino et al. | |
| 2008/0150858 A1 | 6/2008 | Nishi et al. | |
| 2010/0039159 A1 | 2/2010 | Otaka et al. | |
| 2010/0113934 A1 | 5/2010 | Oguzman et al. | |
| 2010/0128898 A1* | 5/2010 | Wong | H03F 1/305 381/94.5 |
| 2012/0250462 A1 | 10/2012 | Franchini et al. | |
| 2012/0313689 A1 | 12/2012 | Bottarel et al. | |
| 2013/0170321 A1 | 7/2013 | Haider et al. | |
| 2014/0085761 A1 | 3/2014 | Croft | |
| 2014/0312954 A1* | 10/2014 | Ghisu | H03K 3/356113 327/333 |
| 2015/0117675 A1 | 4/2015 | Jennings et al. | |
| 2015/0181352 A1 | 6/2015 | Astgimath et al. | |
| 2015/0281836 A1 | 10/2015 | Nguyen et al. | |
| 2015/0318829 A1 | 11/2015 | Astgimath | |
| 2018/0156903 A1 | 6/2018 | Pattipaka et al. | |
| 2018/0226964 A1 | 8/2018 | Terenzi et al. | |
| 2018/0248544 A1 | 8/2018 | Ghisu et al. | |
| 2018/0271493 A1 | 9/2018 | Jensen et al. | |
| 2019/0209139 A1 | 7/2019 | Petersen | |

OTHER PUBLICATIONS

Tripath Technology, Inc., "TAA4100—Four Channel Class-T Digital Audio Amplifier using Digital Power Processing (DPP™) Technology," MAX14807, Preliminary Information, Revision 0.97, Apr. 2005, 20 pages.

Elmos Semiconductor AG, "Signal Conditioning IC for directly driven ultrasonic sensors," production data sheet, document No. E524.07, QM-No. 25DS0118E.02, Jul. 23, 2015, 39 pages.

* cited by examiner

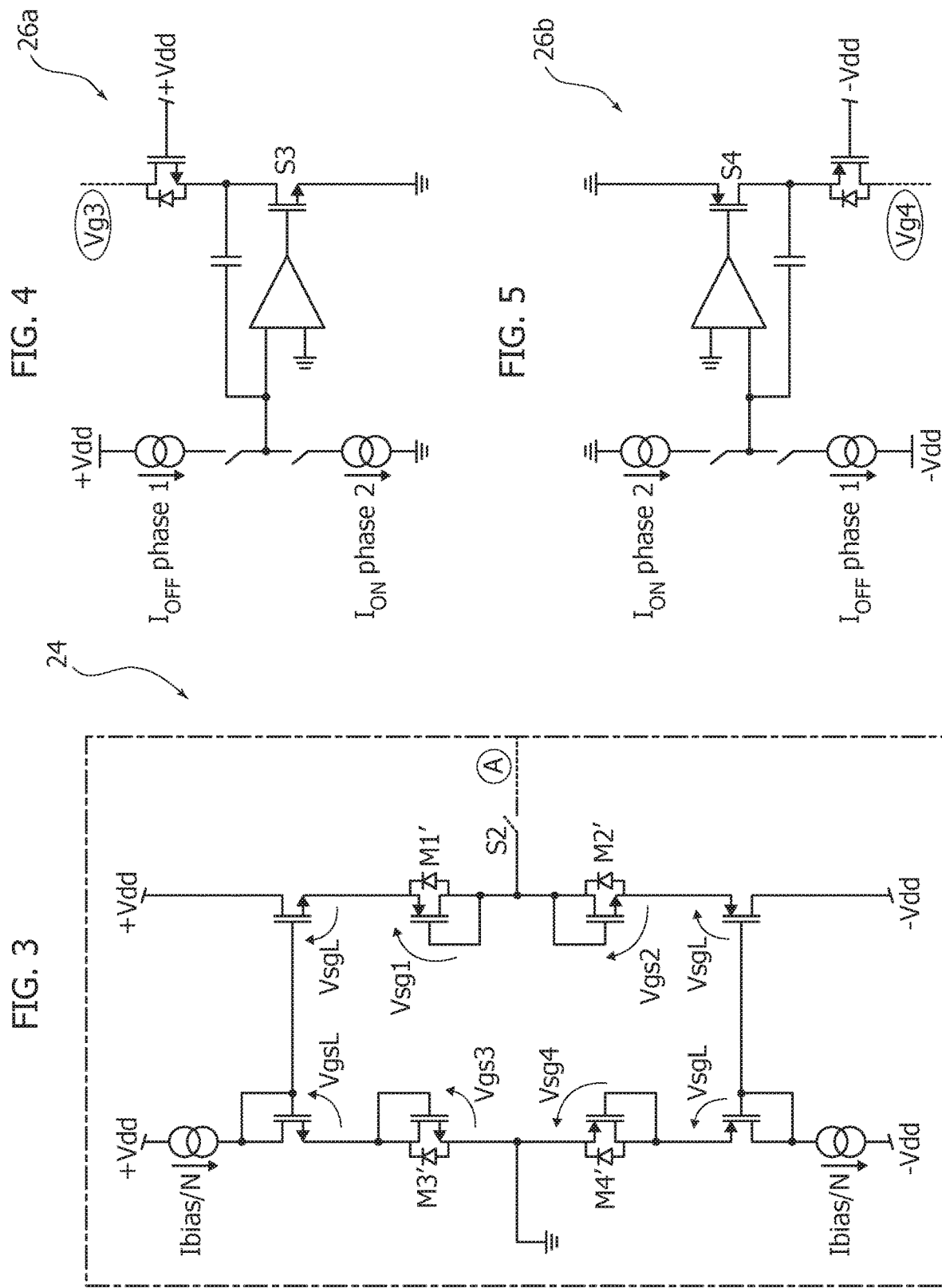

OPERATIONAL AMPLIFIER, CORRESPONDING CIRCUIT, APPARATUS AND METHOD

BACKGROUND

Technical Field

The description relates to operational amplifiers that may be used, for example, in ultrasound transmission channels contained in, for example, ultrasound equipment.

Description of the Related Art

Operational amplifiers (op-amp) are circuits able to amplify an arbitrary input signal of a few volts (such as 2 V peak-to-peak) into an output signal that, in high-voltage (HV) operational amplifiers (op-amp), can reach values of several hundred volts (for example 200 V peak-to-peak).

Such amplifiers may be in the form of two-terminal amplifiers that are able to generate a positive and negative output signal in relation to a reference potential (for example a ground level GND), with the option for example of operating as high-voltage linear drivers or drive circuits.

A significant domain of application is ultrasound equipment, for example diagnostic imaging systems in the medical domain.

In this sector, it is possible to use linear drivers as power stages for driving a piezoelectric actuator in an ultrasound probe. In high-end systems, linear drivers of this type may be used instead of digital pulse generators ("impulsators") to facilitate the generation of high-definition images.

Despite such activity, there is nonetheless a need for systems that can be used for example to make high-voltage (HV) components that enable the handling of low-voltage (LV) signals using different types of technology, such as bipolar CMOS-DMOS technology (BCD).

BRIEF SUMMARY

One or more embodiments are directed to an operational amplifier and one or more embodiments also concern a corresponding circuit (for example an ultrasound channel), a corresponding apparatus (for example an ultrasound apparatus) and a corresponding method.

The claims are an integral part of the technical teaching provided in relation to the embodiments.

One or more embodiments may offer one or more of the following advantages:

reduction of spurious signals generated, for example during power-up and power-down transients, by a high-voltage operational amplifier, which may be single stage (for example with a source follower output), option of powering down the operational amplifier almost completely when inactive, saving the power consumed from the high-voltage power supplies, option of using such powering-down to apply one or more embodiments in multiple-drive channels, i.e., where there may also be an impulsator in parallel with a linear driver, with the possible application of the solution to linear amplifiers with output diodes.

BRIEF DESCRIPTION OF THE SEVERAL VIEWS OF THE DRAWINGS

One or more embodiments are described below by way of nonlimiting example with reference to the attached figures, in which:

FIGS. 3, 4 and 5 are more detailed circuit diagrams relating to possible features of embodiments.

DETAILED DESCRIPTION

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The references used here are provided merely for convenience and as such do not define the scope of protection or the scope of the embodiments.

Figure 1:
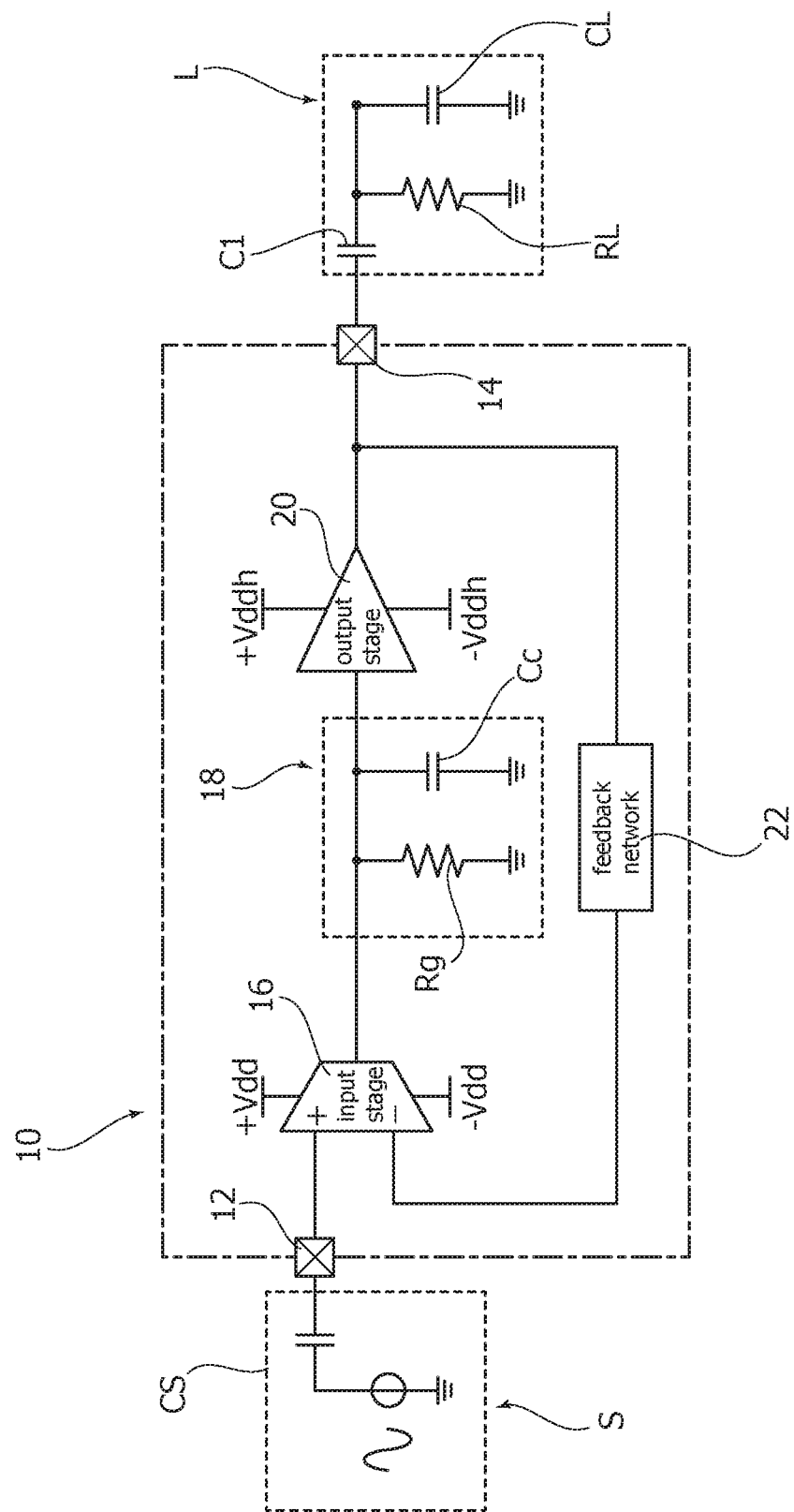
FIG. 1 is an overview of an operational amplifier.

FIG. 1 shows an example of a possible operational amplifier (op-amp) structure 10, for example a high-voltage (HV) operational amplifier.

An amplifier 10 as exemplified in FIG. 1 may include an input terminal 12 that can be coupled to a power source S and an output terminal 14 that can be used to drive a load L.

For example, the source S may comprise a low-voltage source (for example 2 V peak-to-peak) coupled to the input terminal 12 with a coupling capacitor CS.

The load L can for example be represented by a piezoelectric transducer ideally represented as a parallel connection of a resistor RL and of a capacitor CL coupled to the output terminal 14 (sometimes referred to as XDCR in piezoelectric transducer applications, for example for ultrasound channels) via a further capacitor C1.

This representation of the source S and of the load L is provided purely by way of example, and it should also be noted that the source S and the load L may be separate elements depending on the embodiment.

A diagram such as the one shown for example in FIG. 1 shows, moving from the input terminal 12 towards the output terminal 14:

an input stage 16 operating for example between opposing voltages +Vdd and −Vdd, a gain node 18 (in this case ideally shown schematically as a parallel connection between a resistor Rg and a capacitor Cc), and an output stage 20 operating for example between opposing voltages +Vddh and −Vddh.

A feedback network 22 may be provided to bring a feedback signal from the output terminal 14 to the input stage 16.

In solutions such as the one shown by way of example in FIG. 1, the input stage 16 can therefore be configured as a differential stage that receives the signal on the input terminal 12 at one input (for example non-inverting) and the feedback signal from the output terminal 14 at a second input (for example inverting).

In one or more embodiments, the input stage 16 can be configured as a low-voltage (LV) stage operating between two power supply voltages +Vdd, −Vdd that can be assumed to be "low" voltages (for example Vdd<5 V) compared to "high" voltages, i.e., the voltages +Vddh, −Vddh between which the high-voltage (HV) output stage operates (for example where Vddh is 200 V).

The input stage 16 may be used to measure the difference between the input signal at the input terminal 12 and the feedback signal of the network 22 such as to generate an error current Ierr proportional to said difference. This current may develop a high-voltage signal on the gain node 18 that alone constitutes the desired output.

However, this signal may not be strong enough to drive the load L directly. For this reason, the stage 20 may be provided to provide the required power. From this point of view, the output stage 20 can be seen as a unity gain block with a high-impedance input and a low-impedance output (for example an impedance Zout that is much lower than the corresponding impedance at the parallel connection of the resistor RL and of the capacitor CL).

As previously stated, the input stage 16 can be powered at low voltage, while the gain node 18 and the output stage 20 can be powered at high voltage, and are for example made using power DMOS transistors that are able to withstand high breakdown voltages and to provide currents of a given intensity (for example of around 3 A).

A diagram such as the example in FIG. 1 is sometimes referred to as a single-stage high-voltage operational amplifier, i.e., with a single gain node 18.

In applications such as imaging applications (for example in the medical domain), an amplifier 10 such as the example shown in FIG. 1 can be used as a driver, and operation of same may be based on alternating transmission and reception phases in which, in the transmission phases, the driver sends high-voltage excitation signals to a load L, comprising for example a piezoelectric transducer, while in the reception phases, the power driver is inactive.

In applications in which the powers in play have high values, the management of the power can be key. This may be the case for implementation on semiconductor integrated circuits (such as silicon).

In this domain, it is conceivable to power up on the driver only for the time required to send the excitation signal of the transducer and to keep the driver powered down during the reception phase. In applications of this type, consumption from the high-voltage power supplies when the driver is inactive may be significant. It is therefore desirable for such consumption to be as low as possible, and ideally virtually zero.

Indeed, certain applications require a single channel (such as an ultrasound channel) to have a linear driver, such as the one shown by way of example in FIG. 1, and a digital impulsator. In this case, it is again desirable to be able to power down the linear driver (or in any case to isolate same from the digital impulsator), thereby preventing unwanted crossed interference.

In summary, it is desirable for the linear drivers under discussion to be able to alternate (brief) transmission phases with (long) reception phases, and for same to be powered down when not active, for two main reasons:
to reduce dissipated power, and/or
to avoid inducing disturbance phenomena related to any digital impulsators present on a transmission channel on which two types of driver (linear and pulse) are being used.

Powering up and down alternately can generate spurious signals (glitches) on the output. These signals are at least potentially harmful for the application, since the same are for example liable to generate defects in the final image of an ultrasound imaging apparatus.

It has been observed that such glitch phenomena can be attributed primarily to the fact that, once powered down, the driver can lose the working point, which may result in settling transients occurring when the driver is powered up again, these transients being difficult to control. Such transients are liable to result in output glitch phenomena of significant amplitude (for example several volts), which are considered to be harmful in applications such as ultrasound applications.

It has also been observed that output transients from an amplifier such as the amplifier 10 previously described by way of example may have high aspect ratios, being dimensioned to carry currents of several amps. Consequently, uncontrolled transients at the ends of said transistors when powering up and down can generate high currents (with spurious output voltages of several volts), with the risk in some conditions of bringing the output of the amplifier to a high-voltage power supply (for example Vddh) to saturation before settling at a desired operating point.

Somewhat similar issues have been addressed in the audio field, where glitch phenomena can cause audible noise during power-up. Solutions described in the present document involve the use of two different bias currents: one higher bias current used when the amplifier is active and another lower bias current used when the amplifier is not in use. This makes it possible to keep the nodes of the circuit at a value close to the efficient working point.

It has been observed that this solution may involve a significant static consumption from the power supplies, and as such same cannot be used in high-voltage (HV) applications.

Figure 2:
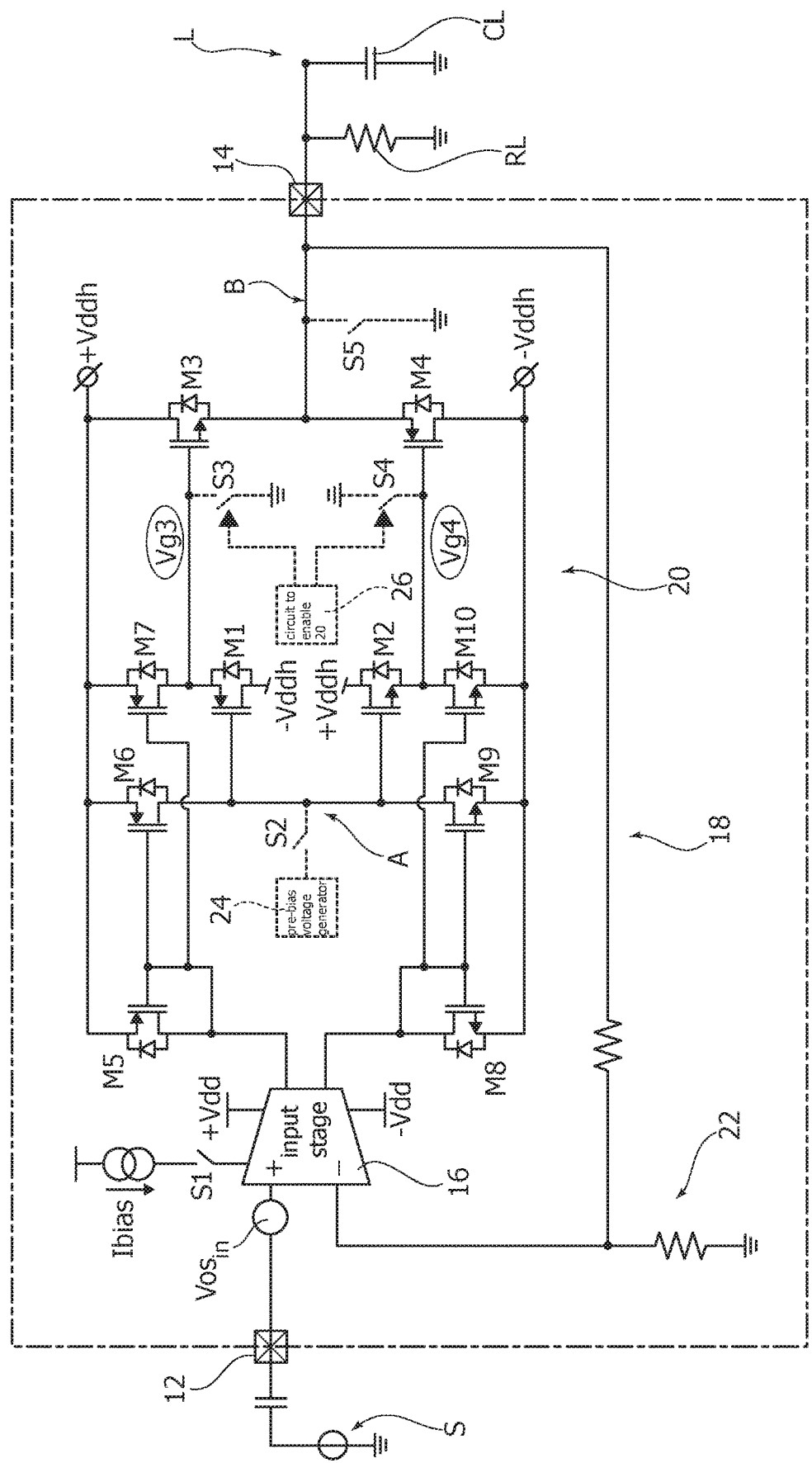
FIG. 2 is an example circuit diagram of one or more embodiments.

FIG. 2 is an example of one or more embodiments that develop the overview in FIG. 1, involving the inclusion of a source follower output stage and circuits (shown using dotted lines) that are designed to control and reduce the glitch produced during power-up and power-down of the amplifier 10.

For reference purposes, portions and components already described in relation to the diagram in FIG. 1 are indicated in FIG. 2 using the same reference signs, and accordingly the related detailed description has not been reproduced.

Also in FIG. 2, the input stage 16 may be made up of low-voltage (LV) components and receive a bias current Ibias (generated in a known manner) that is liable to be mirrored over the entire circuit, including the high-voltage portion.

The reference sign S1 indicates a first switch (for example a solid-state switch such as a transistor) that is able to couple and decouple the source Ibias from the circuit 10, and the aforementioned current mirror mechanism enables consumption to be reduced to zero, including in the high-voltage portion.

In the diagram in FIG. 2, reference signs M1, . . . , M10 indicate transistors that can for example include high-voltage DMOS transistors.

In one or more embodiments, the following can be seen in circuits including such transistors:
a first branch, with the transistors M5, M6 and M7, which form a (first) current mirror connected to the positive high-voltage power supply (+Vddh), and a second branch, with the transistors M8, M9 and M10, which form a (second) current mirror connected to the negative high-voltage power supply (−Vddh).

In one or more embodiments, in a position interposed between the aforementioned current mirrors (for example in a position interposed between the current paths (source-drain, in the case of field-effect transistors (of the transistors M6 and M9—for example in a position interposed between the drains DM6 and DM9—it is possible to identify the presence of a node A related to the control terminals (gates, in the case of field-effect transistors)) of M1 and M2, thereby establishing a gain node.

The transistors M3 and M4 conversely form an output stage 20 that is able to supply the necessary power to the load L.

In one or more embodiments, the transistors M3 and M4 of the output stage may have current generation terminals (sources, in the case of field-effect transistors) in common and shared with the output terminal 14 such as to behave as a source follower.

In one or more embodiments, the control terminals (for example gates) of the transistors M3 and M4 may be connected directly to the node A and are instead driven by the node A via a pre-stage formed for example by the transistors M1 and M7 and by the transistors M2 and M10, which are also used as source followers.

In one or more embodiments, there may be a pre-bias voltage generator 24 associated with a further switch (for example an electronic switch) S2 that is able to set the gain node A to a reference potential when the operational amplifier 10 is powered down.

In one or more embodiments, the control terminals (gates) of the transistors M3 and M4 of the output stage 20 may be associated with further switches (for example electronic switches) S3 and S4 driven by a respective circuit 26 to enable the output stage formed by the transistors M3 and M4 to be powered up and powered down.

In an intermediate position between the output transistors M3 and M4 (in practice at the output terminal 14, also indicated here as node B), there may be a further switch S5 designed to bring the output terminal 14 to a reference level (for example ground) when powering down the amplifier 10.

Examples of possible implementations of the blocks 24 and 26 are described below with possible methods for coordinating the operation of same with the operation of the switches S1, S2, S3, S4 and S5.

For the sake of simplicity, reference shall be made to tables in which "open" and "closed" indicate respectively the non-conductive state and conductive state of a given electronic switch S1, S2, S3, S4 and S5.

This is in all cases coordinated with the indication of the voltages on points A (gain node) and B (output node) cited above, as well as the nodes Vg3 and Vg4 corresponding respectively to the voltages on the control terminals (gates) of the transistors M3 and M4.

In the powered-down state (OFF), the switches are in the following state:

| Op-Amp state | S1 | S2 | S3 | S4 | S5 |
|---|---|---|---|---|---|
| OFF | Open | Closed | Closed | Closed | Closed | with the nodes in the high-voltage portion HV set to the following voltages:

| Op-Amp state | A | Vg3 | Vg4 | B |
|---|---|---|---|---|
| OFF | Vref | 0 V | 0 V | 0 V |

In this state, there is in practice no current consumed from the power sources and the output MOSFET transistors M3 and M4 are kept powered down by the switches S2, S3 and S4:

$$Vgs_3 = Vg_3 - V_B = 0 \text{ V} \quad Vsg_4 = V_B - Vg_4 = 0 \text{ V}$$

where $Vgs_3$ and $Vsg_4$ indicate the gate-source voltages of the transistors M3 and M4, $Vg_3$ and $Vg_4$ are the respective gate voltages, $V_B$ is the voltage on the node B (output terminal 14) and Vref is a voltage generated by the circuit 24 discussed below. This voltage may be a few hundred mV (|Vref|<300 mV), and as such M1 and M2 are also powered down.

In one or more embodiments, to bring the amplifier 10 from the "OFF" state to the "ON" state ready for transmission, a sequence of phases such as the one described below may be used.

These phases ensure that the nodes A, Vg3, Vg4 and B are kept under control to prevent output glitches.

In a first phase, current is supplied to the circuit, for which the only switch to change state is S1, changing from "open" to "closed." Consequently, current begins to flow also in the high-voltage portion, but the output cannot be moved either because it is linked by S5 to GND or because S3 and S4 divert the bias current, keeping M1, M2, M3 and M4 powered down. This results in a link to the resistance, as well as the dimensions, of the transistors used to provide the switches S3 and S4:

$$RS3.Ibias' < Vthn \quad RS3.Ibias' < Vthn$$

where RS3 and RS4 are the ON resistance (Ron) of the transistors M3 and M4, Vthn and Vthp are the threshold voltages of the transistors M3 and M4 and Ibias' represents the bias current Ibias as "mirrored" in the high-voltage (HV) portion from the input stage 16, with the possibility of being multiplied by a multiplication factor.

In this phase, the node "A" is kept at all times at Vref via the switch S2, which connects same to the circuit 24.

The state of the switches S3 and S4 then changes, the switches being powered down via the block 26 (discussed below) which may power down these switches slowly or suddenly.

The transistors M1, M2, M3 and M4 also begin to carry current gradually. At the end of this phase, there is no longer any current flowing through S3 and S4 and the transistors M3, M4 are biased at the operating current of same: the output stage 20 is then powered up and the feedback 22 correctly closed (with the switches S2 and S5 still closed, and with output node B consequently continuing to be held at ground).

With reference to this phase, it can be seen that the node "A" would be brought to the voltage Vref even in the absence of the circuit 24. By including this circuit, the node "A" can be pre-biased to the desired value, thereby preventing an uncontrolled voltage transient on this node.

Finally, by opening S2 and S5, it is also possible to release nodes "A" and "B." At this point, the feedback loop is effectively closed and the nodes "A" and "B" can settle to the respective working point thereof. The final value of same will be affected by the total offset of the amplifier, shown in FIG. 2 as an ideal voltage generator of value $Vos_{in}$ acting on the non-inverting input of the stage 16.

The tables below summarize a possible sequence of actions of the switches (open, closed) and the voltage values assumed by the main nodes when moving from the OFF state to the ON state (powering up).

| Op-Amp state | S1 | S2 | S3 | S4 | S5 |
|---|---|---|---|---|---|
| OFF | Open | Closed | Closed | Closed | Closed |
| Phase 1 off > on | Closed | Closed | Closed | Closed | Closed |
| Phase 2 off > on | Closed | Closed | Open | Open | Closed |
| ON | Closed | Open | Open | Open | Open |

| Op-Amp state | A | Vg3 | Vg4 | B |
|---|---|---|---|---|
| OFF | Vref | 0 V | 0 V | 0 V |
| Phase 1 off > on | Vref | ≈Vthn | ≈Vthp | 0 V |
| Phase 2 off > on | Vref | Vgs3 | −Vsg4 | 0 V |
| ON | Vref + Vos | Vgs3 + Vos | Vos − Vsg4 | Vos |

The final value of the node B shall be Vos, i.e., the input offset multiplied by the gain of the amplifier.

By inserting these blocks into an amplifier and following these phases, the amplifier can be brought from the OFF state (with virtually zero high-voltage consumption) to the ON state (with the op-amp ready to transmit), minimizing the spurious signals generated at output.

In order to prevent the generation of glitches (also when powering down a linear driver based on an amplifier such as the example amplifier here, from the ON state it is possible to activate first S2 by powering same up (i.e., by making same conductive) to set the node "A" to Vref, with the node "B" potentially still being brought to GND and therefore set by S5. By closing S2, S3 and S4 may also be powered up, the switches being controllable by the circuits 26 to ensure that M3 and M4 are not powered down suddenly.

In one or more embodiments, in the final phase of the powering down operation, it is possible two interrupts the bias current Ibias, for example by opening S1.

The tables below summarize a possible sequence of actions of the switches (open, closed) and the voltage values assumed by the main nodes when moving from the ON state to the OFF state (powering down).

| Op-Amp state | S1 | S2 | S3 | S4 | S5 |
|---|---|---|---|---|---|
| ON | Closed | Open | Open | Open | Open |
| Phase 1 on > off | Closed | Closed | Closed | Closed | Closed |
| OFF | Open | Closed | Closed | Closed | Closed |

| Op-Amp state | A | Vg3 | Vg4 | B |
|---|---|---|---|---|
| ON | Vref + Vos | Vgs3 + Vos | Vsg4 + Vos | Vos |
| Phase 1 on > off | Vref | ≈Vthn | ≈Vthp | 0 V |
| OFF | Vref | 0 V | 0 V | 0 V |

Block 24 (pre-bias voltage generator) and block 26 (driving of switches S3 and S4) are described below.

In one or more embodiments, the block 24 may be used to replicate the reference voltage for node A, bringing same as close as possible to the voltage that said node would adopt without said circuit.

As shown in FIG. 2, the mesh formed by M1, M3, M4 and M2 can be described using the following equation:

$$Vsg1 - Vgs3 - Vsg4 + Vgs2 = 0 \text{ V}$$

where Vsg and Vgs represent the source-gate or gate-source voltages of the different transistors involved, and $$VA + Vsg1 - Vgs3 = VB$$

and $$VA - Vgs2 + Vsg4 = VB$$

During power up when S5 is closed, the potential of the node B corresponds to GND, VB=0 V, hence:

$$VA = Vgs3 - Vsg1$$

and $$VA = Vgs2 - Vsg4$$

In one or more embodiments, the circuit 24 can be used to generate VA.

FIG. 3 shows one possible implementation, in which the MOS transistors M1', M2', M3' and M4' are replicas, with dimensions scaled by a factor N, of the high-voltage (HV) transistors M1, M2, M3 and M4 used in the linear driver.

This circuit can be powered at low voltage (Vdd) and biased using a current Ibias that is also scaled by a factor N, being the same factor as used for the MOS transistors. Consequently, the gate-source voltages of the scaled MOSs are identical to those on the transistors of the operational amplifier.

Following the mesh shows that the voltages at the node A are as follows:

$$VA = Vgs3 + VgsL - VgsL - Vsg1 = Vgs3 - Vsg1$$

or $$VA = -Vsg4 - VsgL + VsgL + Vgs2 = -Vsg4 + Vgs2$$

where VsgL and VgsL represent the source-gate voltage and gate-source voltage of the MOS transistors arranged "outside" the MOS transistors M1', M2', M3' and M4' on the two branches of the circuit interposed between the voltages +Vdd and −Vdd with:

M1' and M2' with the source-gate current paths of same being in series with one another on the first branch with the switch S2 interposed between same, M3' and M4' with the source-gate current paths of same being in series with one another on the second branch and the intermediate point between same being grounded, the gates of the aforementioned MOS transistors arranged "outside" and connected to one another in pairs respectively on the "high" side (+Vdd) and on the "low" side (−Vdd) of the circuit, and all of the transistors shown in FIG. 3, except the "outside" transistors of the branch including M1' and M2', arranged with the control terminal (gate) connected to the current path (source-drain).

FIGS. 4 and 5 show possible example implementations of the circuit 26, in which the switches S3 and S4 can be made for example as in 26a (FIG. 4) and 26b (FIG. 5), or with a LV MOSFET and with a protective HV MOS transistor interposed between the drains of same and the lines/voltages Vg3 and Vg4.

With this topology, the nodes Vg3 and Vg4 can be voltage controlled. In particular, during power up and power down of the linear driver 10, said nodes can move according to ramps, the incline of which can be determined by changing the values of the currents $I_{ON}$ or $I_{OFF}$.

Figure 6:
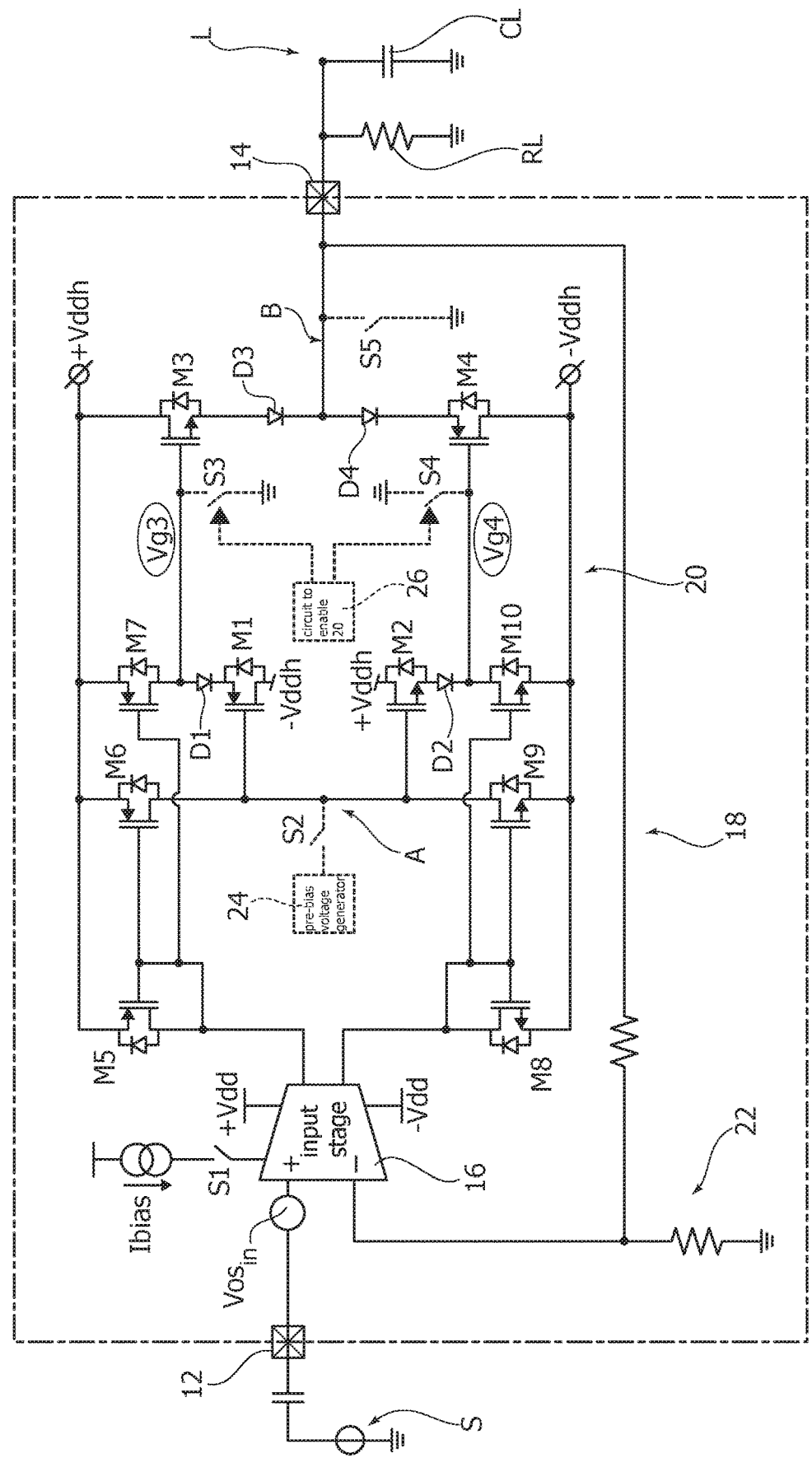
FIG. 6 is an example circuit diagram of embodiments.

These circuits and power-up phases can also be applied to linear drivers that have diodes in series with the output MOS transistors, as exemplified in FIG. 6.

Solutions such as the ones exemplified above can also be used in the linear drivers shown in the example diagram in FIG. 6, in which the output transistors M3 and M4 have diodes D3, D4 in series (i.e., interposed in the current paths of the output transistors M3 and M4) with the possible presence of corresponding level translator diodes D1, D2 on the sources M1 and M2.

Figure 7:
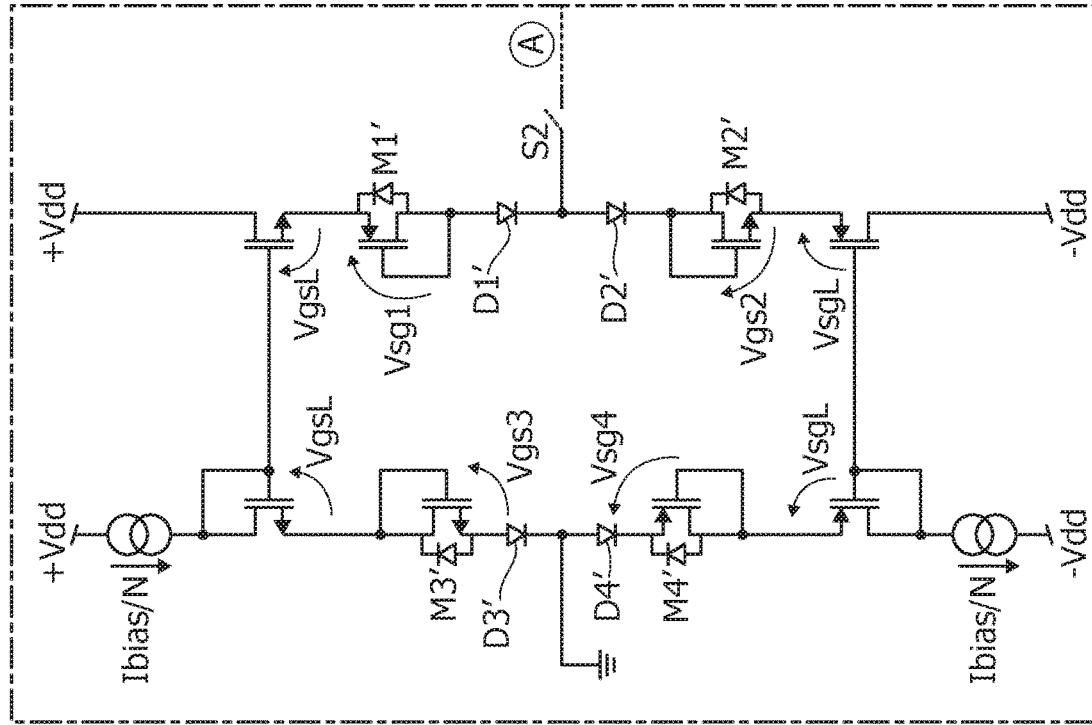
FIGS. 7 and 8 are examples of possible implementation details of one or more embodiments.
Figure 8:
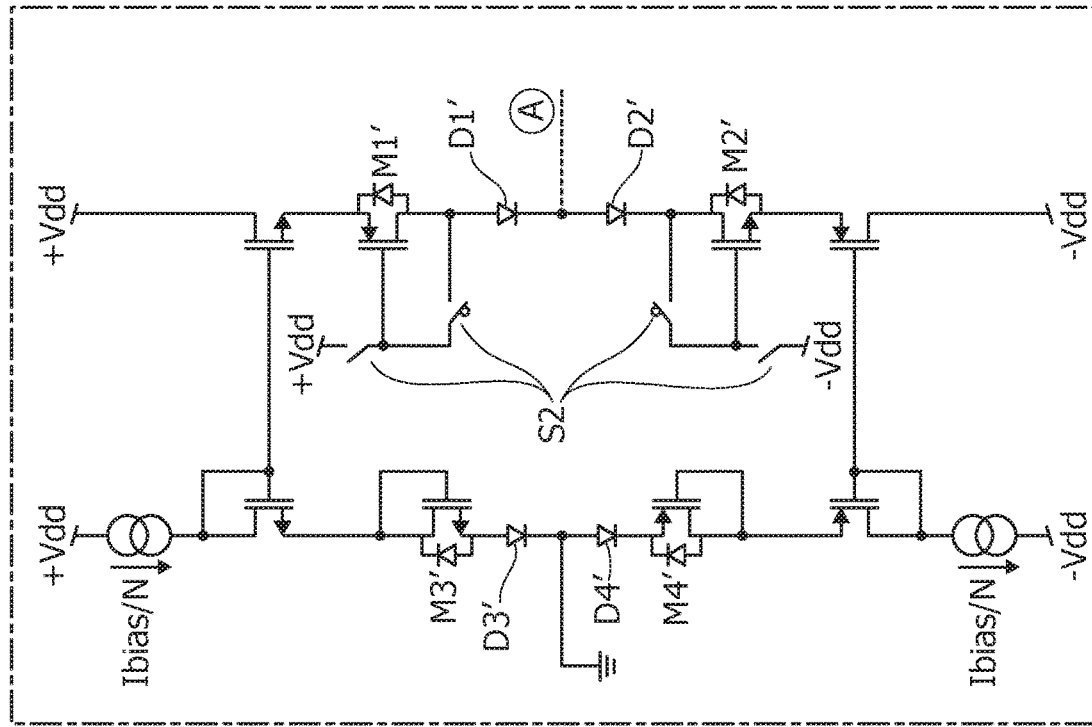

FIGS. 7 and 8 show possible example modifications of the pre-bias generator circuit 24 that replicates the output structure with corresponding diodes D1', D2', D3', D4' in series with (and inside) the MOS transistors M1', M2', M3', M4', respectively.

Comparing FIG. 7 with FIG. 8 shows that the addition of said diodes makes it possible to incorporate the switch S2 into the circuit itself in one or more embodiments.

One or more embodiments may therefore relate to an amplifier (for example 10) having an input terminal (for example 12) and an output terminal (for example 14), the amplifier comprising:

an input stage (for example 16) coupled to the input terminal, an output stage (for example 20; M3, M4) coupled to the output terminal, a gain node (for example A) between the input stage and the output stage, a bias current source (for example Ibias) couplable (for example via the switch S1) to the input stage to supply a bias current thereto, a current mirror circuit (for example M5, M6, M7; M8, M9, M10) to mirror the bias current supplied to the input stage toward the gain node and the output stage, a switch circuit (for example S2; S3, S4) comprising a switch (for example S2) activatable to bring the gain node to a pre-bias voltage (for example 24) and further switch means (for example S3, S4) coupled to the output stage and switchable between a first state and a second state in which the output stage is active and non-active, respectively, and a further switch circuit (for example S5) coupled to the output terminal and switchable between a first state and a second state in which the output of the output stage is coupled to the output terminal and to a reference level, respectively.

In one or more embodiments, said output stage may include a source follower stage.

In one or more embodiments, said output stage may include a source follower drive circuit (for example M1, M7; M2, M10) coupled to the gain node.

One or more embodiments may include a feedback network (for example 22) from the output terminal to the input stage.

In one or more embodiments, the current mirror circuit and the output stage may comprise complementary branches (for example M5, M6, M7 and M8, M9, M10 as well as M3 and M4) coupled to supply lines (for example+Vddh, −Vddh) of opposing polarity with the gain node and the output terminal (for example 14, also identified as B) positioned between the complementary branches of the current mirror circuit and of the output stage, respectively.

One or more embodiments may include:

low-voltage first supply lines (for example+Vdd, −Vdd) for said input stage, and high-voltage second supply lines (for example+Vddh, −Vddh) for the current mirror circuit and the output stage.

One or more embodiments may comprise a pre-bias circuit (for example 24) for supplying said pre-bias voltage, said pre-bias circuit preferably coupled to said low-voltage supply lines and biased by means of a scaled version (for example Ibias/N) of said bias current.

One or more embodiments may include said switch (for example S2) built into said pre-bias circuit.

In one or more embodiments, said further switch means (for example S3, S4) may comprise switches (see for example 26; 26a, 26b) switchable ramp-like between a conductive state and a non-conductive state and preferably comprise a low-voltage MOSFET transistor coupled to a high-voltage protective MOSFET transistor.

In one or more embodiments the output stage may comprise transistors with diodes (see for example D3, D4 in FIG. 6) arranged in series to the respective current paths.

In one or more embodiments, the pre-bias circuit (for example 24 in FIG. 7 and FIG. 8) may comprise a scaling network for said bias current comprising transistors (for example M1', M2', M3', M4') with respective diodes (for example D1', D2', D3', D4') in series with the respective current paths, with said switch (for example S2) comprising respective switch units (see for example FIG. 8) acting between said low-voltage supply lines and the control terminals of at least some of the transistors of said scaling network.

In one or more embodiments, a circuit may include:

a drive device (for example S, 10) comprising an amplifier according to one or more embodiments, and a load (for example L) coupled to the output terminal of the amplifier, the load optionally comprising an ultrasonic transducer driven by means of the amplifier (10).

In one or more embodiments, an ultrasound apparatus may include a circuit according to one or more embodiments.

A method of operating an amplifier according to one or more embodiments may comprise switching the amplifier alternately between active state and non-active states, in which:

in said active state, said bias current source (Ibias) is coupled (for example via the switch S1) to said input stage and said bias current is mirrored toward the gain node and the output stage by the current mirror circuit with said switch (for example S2) deactivated and said further switch means (for example S3, S4) brought into said first state with the output stage active and said further switch circuit (for example S5) into the first state with the output of the output stage coupled to said output terminal, and in said non-active states, said bias current source is decoupled (for example by opening S1) from the input stage, with said switch (for example S2) activated to bring the gain node to said pre-bias voltage (for example 24), the further switch means (for example S3, S4) to said second state with the output stage inactive and said further switch circuit (for example S5) to the second state with the output of the output stage coupled to said reference level.

In one or more embodiments, such a method may include:

a) during the transition from said non-active state to said active state, the steps (for example the sequence) of:
coupling said bias current source to said input stage,
switching said further switch means from said second state to said first state,
deactivating said switch by switching said further switch circuit into said first state, and b) during the transitions from said active state to said non-active state, the steps (for example the sequence) of:
activating said switch to bring the gain node to said pre-bias voltage by bringing said further switch means into said second state, and
bringing said further switch circuit into said second state by decoupling said bias current source from said input stage.

Notwithstanding the basic principles, the implementation details and embodiments may vary, even significantly, from those given here purely by way of nonlimiting example, without thereby moving outside the scope of protection.

This scope of protection is defined by the attached claims.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An amplifier, comprising:
an input terminal and an output terminal;
an input stage coupled to the input terminal;
an output stage coupled to the output terminal;
a gain node between the input stage and the output stage;
a bias current source configured to be coupled to the input stage to supply a bias current to the input stage;
a current mirror circuit configured to mirror the bias current supplied to the input stage to generate at least one mirrored bias current and configured to supply the at least one mirrored bias current to the gain node and the output stage, the output stage including a source follower stage;
a first switch circuit including a node coupled to receive a pre-bias voltage and coupled to the gain node, the first switch circuit configured, in response to being activated, to couple the gain node to the node coupled to receive the pre-bias voltage and to isolate the gain node from the node coupled to receive the pre-bias voltage in response to being deactivated;
a second switch circuit coupled to the output stage and configured in response to being deactivated to deactivate the output stage; and
a third switch circuit coupled to the output terminal and configured, in response to being activated, to couple the output terminal to a node coupled to receive a reference voltage and configured in response to being deactivated to isolate the output terminal from the node receiving the reference voltage.

2. The amplifier of claim 1, wherein the amplifier is configured to operate in a powered-off state of operation with each of the first switch circuit, second switch circuit and third switch circuit being deactivated in the powered-off state of operation, and wherein the amplifier is further configured to operate in a powered-on state operation with each of the first switch circuit, second switch circuit and third switch circuit being activated in the powered-on state of operation.

3. The amplifier according to claim 2, wherein the amplifier is further configured to operate in a first phase powered-off state of operation immediately after operating in the powered-off state, each of the first, second and third switch circuits being activated in the first phase powered-off state of operation, and wherein the amplifier is further configured to operate in a second phase powered-off state of operation immediately after the first phase powered-off state with each of the first and third switch circuits being activated and the second switch circuit being deactivated in the second phase powered-off state of operation.

4. The amplifier according to claim 2, wherein the output stage further comprises a source follower drive circuit coupled to the gain node.

5. The amplifier according to claim 1, further comprising a feedback network coupled to the output terminal and the input stage.

6. The amplifier according to claim 1, further comprising:
low-voltage first supply lines coupled to said input stage, and
high-voltage second supply lines coupled to the current mirror circuit and the output stage.

7. The amplifier according to claim 6, wherein the high-voltage second supply lines have opposing polarity, and wherein the current mirror circuit and the output stage comprise complementary branches coupled to the high voltage second supply lines with the gain node and the output terminal positioned between the complementary branches of the current mirror circuit and of the output stage, respectively.

8. The amplifier according to claim 7, further comprising a pre-bias circuit configured to supply said pre-bias voltage, said pre-bias circuit coupled to said low-voltage supply lines and configured to be biased by a scaled version of said bias current.

9. The amplifier according to claim 8, wherein said first switch circuit is incorporated in said pre-bias circuit.

10. The amplifier according to claim 1, wherein said second switch further comprises additional switches configured to be switched ramp-like between a conductive state and a non-conductive state, each of the additional switches comprises a low-voltage MOSFET transistor coupled to a high-voltage MOSFET transistor.

11. The amplifier according to claim 6, wherein the output stage further comprises a transistor coupled in series with a diode between each of the high-voltage second supply lines and the output of the output stage.

12. The amplifier according to claim 9, wherein said pre-bias circuit further comprises a scaling network configured to scale said bias current, the scaling network comprising a plurality of transistors, each of the plurality of transistors coupled in series with a respective diode, wherein said first switch circuit comprises a plurality of respective switch circuit coupled between said low-voltage first supply lines and control terminals of at least some of the plurality of transistors of said scaling network.

13. A circuit, comprising:
a drive device including an amplifier, the amplifier including:
an input terminal and an output terminal;
an input stage coupled to the input terminal;
an output stage coupled to the output terminal;
a gain node;

a bias current source that is selectively coupled to the input stage to supply a bias current to the input stage;

a current mirror circuit coupled to the gain node, the current mirror circuit in operation mirroring the bias current supplied to the input stage to generate at least one mirrored bias current and in operation supplying the at least one mirrored bias current to the gain node and to the output stage, the output stage including a source follower stage;

a first switch circuit including a node coupled to receive a pre-bias voltage and being coupled to the gain node, the first switch circuit in operation, in response to being activated, coupling the gain node to the pre-bias voltage and isolating the gain node from node receiving the pre-bias voltage in response to being deactivated;

a second switch circuit coupled to the output stage and that in operation, in response to being deactivated, deactivate the output stage;

a third switch circuit coupled to the output terminal and that in operation, in response to being activated, couples the output terminal to a node coupled to receive a reference voltage and that in operation, in response to being deactivated, isolates the output terminal from the node receiving the reference voltage; and a load coupled to the output terminal.

14. The circuit of claim 13, wherein the load comprises an ultrasonic transducer.

15. A method, comprising:

switching an amplifier alternately between an active state and a non-active state, the amplifier including an input stage, and output stage having an output, and a gain node;

in said active state:
providing a bias current to said input stage; and
mirroring the bias current to supply a mirrored bias current to the gain node and to the output stage, the output stage including a source follower stage; and in said non-active state:
terminating the providing of the bias current to the input stage;
driving the gain node to a pre-bias voltage;
deactivating the output stage; and
driving the output of the output stage to a reference voltage level.

16. The method according to claim 15, further comprising:

during a transition of switching the amplifier from said non-active state to said active state:
providing said bias current to said input stage;
activating the output stage; and
isolating the gain node from the pre-bias voltage.

17. The method according to claim 16, further comprising:

during a transition of switching the amplifier from said active state to said non-active state:
providing said pre-bias voltage on the gain node; and
terminating the providing of the bias current to said input stage.

18. The method of claim 15, further comprising:
generating a feedback signal based on the output of the output stage; and
controlling the input stage based on the feedback signal.

19. The method of claim 15, further comprising:
providing a positive high supply voltage and a negative high supply voltage to the output stage; and
in the active state, providing the mirrored bias current to the gain node to charge drive a voltage on the gain node to a level between the positive and negative high supply voltages.

* * * * *